(12) United States Patent
Hosokawa

(10) Patent No.: US 7,060,985 B2
(45) Date of Patent: Jun. 13, 2006

(54) MULTIPOLE FIELD-PRODUCING APPARATUS IN CHARGED-PARTICLE OPTICAL SYSTEM AND ABERRATION CORRECTOR

(75) Inventor: Fumio Hosokawa, Tokyo (JP)

(73) Assignee: JEOL Ltd., Tokyo (JP)

( * ) Notice: Subject to any disclaimer, the term of this patent is extended or adjusted under 35 U.S.C. 154(b) by 19 days.

(21) Appl. No.: 11/009,962

(22) Filed: Dec. 10, 2004

(65) Prior Publication Data

US 2005/0167607 A1  Aug. 4, 2005

(30) Foreign Application Priority Data

Dec. 12, 2003  (JP) .............................. 2003-415027

(51) Int. Cl.
*H01J 3/14* (2006.01)
(52) U.S. Cl. .......................... 250/396 R; 250/396 ML
(58) Field of Classification Search ............. 250/396 R
See application file for complete search history.

(56) References Cited

U.S. PATENT DOCUMENTS

| | | | | |
|---|---|---|---|---|
| 5,051,593 | A * | 9/1991 | Ishihara | 250/396 R |
| 6,646,267 | B1 * | 11/2003 | Haider et al. | 250/396 R |
| 2002/0121609 | A1 * | 9/2002 | Hosokawa | 250/396 ML |
| 2003/0029999 | A1 | 2/2003 | Hosowaka | |
| 2003/0122076 | A1 | 7/2003 | Matsuya et al. | |

* cited by examiner

*Primary Examiner*—Nikita Wells
*Assistant Examiner*—James J. Leybourne
(74) *Attorney, Agent, or Firm*—The Webb Law Firm

(57) ABSTRACT

Spherical aberration correction optics are offered which have an auxiliary function of determining control parameters easily and at any time while canceling deflecting and quadrupole fields in the instrument. The correction optics have a control unit for determining the parameters of the aberration correction optics and parameters for canceling the deflecting and quadrupole fields, a power supply for applying electric potentials or magnetic potentials to the aberration correction optics based on a signal from the control unit, and a period-varying circuit positioned between the control unit and the power supply to add a signal whose amplitude is varied continuously at frequency f with respect to real time t.

4 Claims, 2 Drawing Sheets

MULTIPOLE FIELD-PRODUCING APPARATUS IN CHARGED-PARTICLE OPTICAL SYSTEM AND ABERRATION CORRECTOR

BACKGROUND OF THE INVENTION

1. Field of the Invention

The present invention relates to a multipole field-producing apparatus in a charged-particle optical system and, more particularly, to a multipole field-producing apparatus adapted to be used in an aberration corrector built in an electron microscope.

2. Description of Related Art

Various apparatus for correcting various aberrations in charged-particle optical systems have been proposed. For example, in a known apparatus for correcting spherical aberration in axisymmetric lenses in an electron microscope, two axisymmetric lenses are disposed between two multipole elements that produce hexapole fields. FIG. 3 schematically shows the structure of the illumination system of an electron microscope equipped with the prior art spherical aberration corrector. In the figure, the deflection system and parts of the focusing system are omitted. An electron beam 2 from a source 1 passes through a condenser lens 4 having an aperture 3. The beam made parallel to the optical axis enters spherical aberration correction optics 5. The beam emerging from the correction optics 5 and traveling parallel to the optical axis is directed at a specimen 7 through an objective lens 6.

The spherical aberration correction optics 5 has axisymmetric lenses 10 and 11 disposed between multipole elements 8 and 9 producing hexapole fields. The poles of the multipole elements 8 and 9 are so arranged that they are in phase with respect to the optical axis and that there is no rotational relationship about the optical axis within a plane perpendicular to the optical axis. The lenses 10 and 11 have the same focal length f, Spherical aberration is corrected when the distance between the multipole element 8 and the axisymmetric lens 10 is f, the distance between the axisymmetric lenses 10 and 11 is 2f, the distance between the axisymmetric lens 11 and the multipole element 9 is f, and the multipole elements 8 and 9 have the same excitation strength K and the same width Z (size) in the direction of the optical axis.

A given voltage or current is supplied to each pole of the multipole elements 8 and 9 and to the lenses 10 and 11 from a power supply 13 to correct spherical aberration appropriately. The power supply 13 is controlled by a control unit 14 that determines the value of voltage or current necessary for correction such that the spherical aberration correction optics 5 are controlled via the power supply 13.

In correction of spherical aberration using multipole elements such as hexapole elements, it is desired to produce only the hexapole field to correct the spherical aberration, i.e., to achieve the proper purpose. To produce the hexapole field using hexapole elements, the strength of the hexapole field can be set to any arbitrary value if the strengths of the various poles are set such that $$I_k = A\cos(k\pi) \tag{1}$$

where $I_k$ ($k=1, 2, 3, \ldots, 6$) is the strength of each pole of each hexapole element. In this case, however, the phase angle is fixed, and the parameter controlling the strength is A.

When the hexapole field is produced according to Eq. (1) above, in actual instrumentation, however, deflecting fields (dipole fields, such as positional deviation of the image and coma) and quadrupole fields (astigmatism) are concomitantly produced due to mechanical accuracy at which electrodes or polepieces of the multipole elements forming the apparatus are machined or assembled.

In the past, unwanted aberrations, such as deflecting fields and quadrupole fields, produced concomitantly as described above have been removed as follows. First, the desired hexapole field is produced by setting the parameter A in Eq. (1) above to a desired value. Then, the unwanted aberrations, such as deflecting and quadrupole fields, are detected by some aberration detection means. Based on the results, deflecting and quadrupole fields for canceling the unwanted aberrations, such as deflecting and quadrupole fields, are intentionally produced according to Eq. (2).

$$I_{k+} = C_1\cos\left(\theta_1 + \frac{k\pi}{3}\right) + C_2\cos2\left(\theta_2 + \frac{k\pi}{3}\right) \tag{2}$$

where $I_{k+}$ is the strength of each pole added to $I_k$ of Eq. (1). That is, it is possible to cancel deflecting and quadrupole fields produced concomitantly as control is provided to correct spherical aberration using Eq. (1), by adding Eq. (2) to Eq. (1). In the right side of Eq. (2), $C_1$ and $\theta_1$ are strength and phase angle, respectively, for correction of deflection fields, and $C_2$ and $\theta_2$ are strength and phase angle, respectively, for correction of quadrupole fields.

In the above description, the hexapole field uses hexapole elements. The phase angle of the hexapole field is constant. In actual instrumentation, a dodecapole (12-pole) element, for example, is used to obtain arbitrary phase angle and strength. In the case where the dodecapole element is used, it can be considered that two hexapole elements different in phase angle by 30 degrees are arranged within the same plane. Of course, if such a dodecapole element is used, unwanted aberrations, such as deflecting and quadrupole fields, are similarly produced concomitantly due to dimensional accuracies of components.

Background material is disclosed in Japanese Patent Laid-Open No. 2003-92078, "Spherical Aberration Corrector for Electron Microscope" and Japanese Patent Laid-Open No. 2003-157785, "Charged-Particle Beam Apparatus Equipped with Aberration Corrector".

Where a desired multipole field, such as a hexapole field, is produced using a multipole element, such as a dodecapole element, if unwanted multipole fields, such as deflecting and quadrupole fields, are concomitantly produced due to inaccuracy at which parts are machined or assembled as described above, canceling the unwanted multipole fields using Eq. (2) above constitutes one method. However, it is not easy to implement this method, i.e., unwanted aberrations, such as deflecting and quadrupole fields, are detected by some method and four parameters $C_1$, $\theta_1$, $C_2$, and $\theta_2$ included in Eq. (2) are correctly determined.

SUMMARY OF THE INVENTION

It is an object of the present invention to provide an auxiliary function for determining the above-described four parameters easily and at any time.

An apparatus for creating a multipole field in accordance with the present invention is intended to solve the foregoing problem and characterized in that when a 2n-pole magnetic field is created using at least one magnetic or electrostatic 2n-pole element ($n=1, 2, 3, \ldots$), the strength $I_k$ ($1 \leq k \leq 2n$) of the kth pole in the 2n-pole element is controlled with control parameters A, $C_j$, and $\theta_j$ ($1 \leq j \leq n-1$), based on a control formula given by $$I_k = A(\cos(k\pi) + C_1\cos(\theta_1 + k\pi/n) + C_2\cos2(\theta_2 + k\pi/n) +$$
$$C_3\cos3(\theta_3 + k\pi/n) + \cdots + C_{n-1}\cos(n-1)(\theta_{n-1} + k\pi/n))$$

Furthermore, the control parameter A is varied continuously at frequency f with respect to real time t given by $$A = B \cos(2\pi t f)$$

In addition, an apparatus for creating a multipole field in accordance with the present invention creates a 2m-pole magnetic field (m≦n) using at least one magnetic or electrostatic 2n-pole element (n=1, 2, 3, . . . ). At this time, the strength $I_k$ (1≦k≦2n) of the kth pole of the 2n-pole element is controlled with control parameters A, $C_j$, and $\theta_j$ (1≦j≦n, $C_m$=0), based on a control formula given by $$I_k = A(\cos(mk\pi/n) + C_1\cos(\theta_1 + k\pi/n) + C_2\cos2(\theta_2 + k\pi/n) +$$
$$C_3\cos3(\theta_3 + k\pi/n) + \cdots + C_{n-1}\cos(n-1)(\theta_{n-1} + k\pi/n))$$

In this apparatus, the control parameter A is varied continuously at frequency f with respect to real time t given by $$A = B \cos(2\pi t f)$$

A spherical aberration corrector according to the present invention is built in an electron microscope and has two axisymmetric lenses disposed between two multipole lenses. The multipole element is a magnetic or electrostatic hexapole element. Where a hexapole field is created, the strength $I_k$ (1≦k≦6) of each pole is controlled with control parameters A, $C_1$, $\theta_1$, $C_2$, and $\theta_2$, based on a control formula given by $$I_k = A(\cos(k\pi) + C_1\cos(\theta_1 + k\pi/n) + C_2\cos2(\theta_2 + k\pi/n)$$

In this control, the control parameter A is varied continuously at frequency f with respect to real time t given by $$A = B \cos(2\pi t f)$$

A spherical aberration corrector in accordance with the present invention is for use in an electron microscope and has two axisymmetric lenses disposed between two multipole elements. Each of the multipole elements is a magnetic or electrostatic 2n-pole element (n=1, 2, 3, . . . ). Where a hexapole field is created, the strength $I_k$ (1≦k≦2n) of each pole is controlled with control parameters A, $C_j$, and $\theta_j$ (1≦j≦n), based on a control formula given by $$I_k =$$
$$A(\cos(3k\pi/n) + C_1\cos(\theta_1 + k\pi/n) + C_2\cos2(\theta_2 + k\pi/n) + C_4\cos4$$
$$(\theta_4 + k\pi/n)C_5\cos5(\theta_5 + k\pi/n) + \cdots + C_n\cos n(\theta_n + k\pi/n))$$

At this time, the parameter A is varied continuously at frequency f with respect to real time t given by $$A = B \cos(2\pi t f)$$

An apparatus for creating a multipole field in accordance with the present invention has a function of controlling the strength $I_k$ of each pole while adjusting control parameters $C_j$ and $\theta_j$ (1≦j≦n) when a 2n-pole magnetic field is created using at least one 2n-pole element. Also, the apparatus has a function of continuously varying the control parameter A at the frequency f with respect to real time t. Therefore, when the 2n-pole field is created, unwanted fields of orders lower than 2n produced concomitantly during the creation of the 2n-pole magnetic field can be canceled easily.

Furthermore, a further apparatus for creating a multipole field in accordance with the present invention has a function of controlling the strength $I_k$ of each pole while adjusting the control parameters $C_j$ and $\theta_j$ (1≦j≦n, $C_m$=0) when a 2m-pole magnetic field is created using at least one 2n-pole element. In addition, the apparatus has an additional function of continuously varying the control parameter A at frequency f with respect to real time t. Therefore, unwanted fields other than the 2m-pole field produced concomitantly when the 2m-pole magnetic field is produced can be canceled easily.

A spherical aberration corrector according to the present invention is for use in an electron microscope and has a function of controlling the strength $I_k$ of each pole while adjusting control parameters $C_1$, $\theta_1$, $C_2$, and $\theta_2$ when a hexapole field is created using hexapole elements. Furthermore, the corrector has a function of continuously varying control parameter A at frequency f with respect to real time t. Therefore, unwanted fields of orders lower than the sixth order produced concomitantly during creation of the hexapole field can be canceled easily.

Another spherical aberration corrector according to the present invention is for use in an electron microscope and has a function of the strength $I_k$ of each pole while adjusting control parameters $C_j$ and $\theta_j$ (1≦j≦n) when a hexapole field is created using at least one 2n-pole element. Furthermore, the corrector has a function of continuously varying control parameter A at frequency f with respect to real time t. Consequently, unwanted fields other than the hexapole field produced concomitantly when the hexapole field is created can be canceled easily.

Other objects and features of the present invention will appear in the course of the description thereof, which follows.

DESCRIPTION OF THE PREFERRED
EMBODIMENTS

A preferred embodiment of the present invention is hereinafter described with reference to FIGS. 1 and 2.

Figure 1:
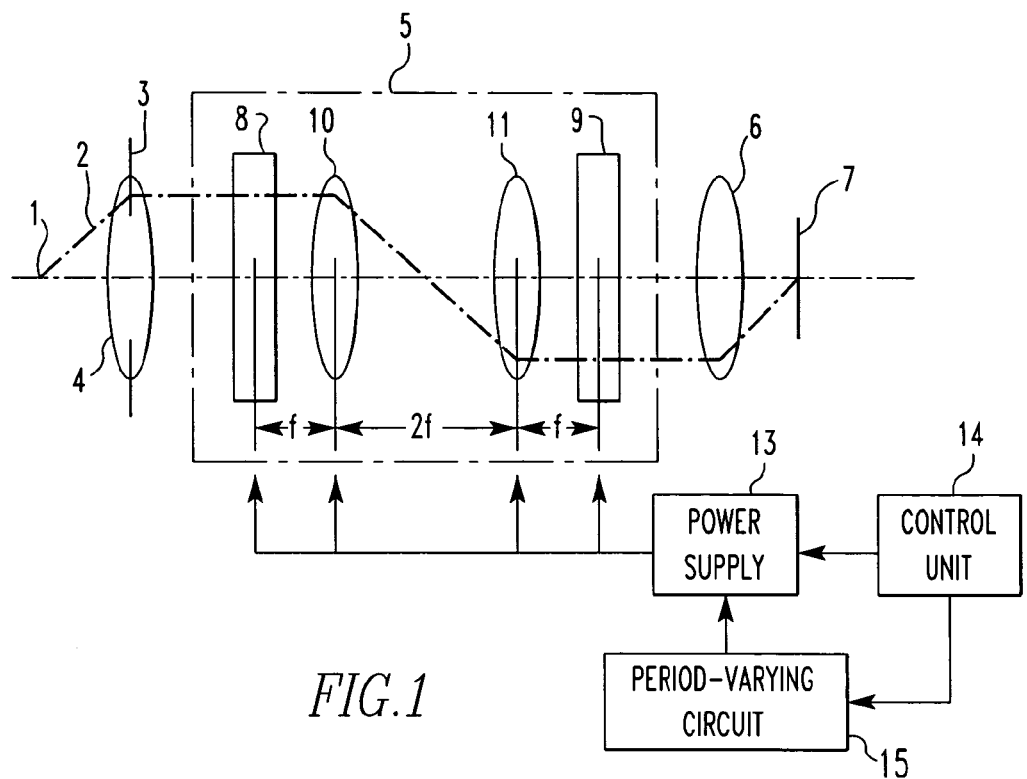
FIG. 1 is a diagram illustrating a spherical aberration corrector built in accordance with the present invention and for use in an electron microscope.

FIG. 1 is a diagram illustrating an embodiment of a spherical aberration corrector for use in an electron microscope, the corrector being fabricated in accordance with the present invention. Like components are indicated by like reference numerals in both FIGS. 1 and 3. The corrector of FIG. 1 is similar to the corrector of FIG. 3 except that a period-varying circuit 15 is added between the control unit 14 and the power supply 13.

Figure 3:
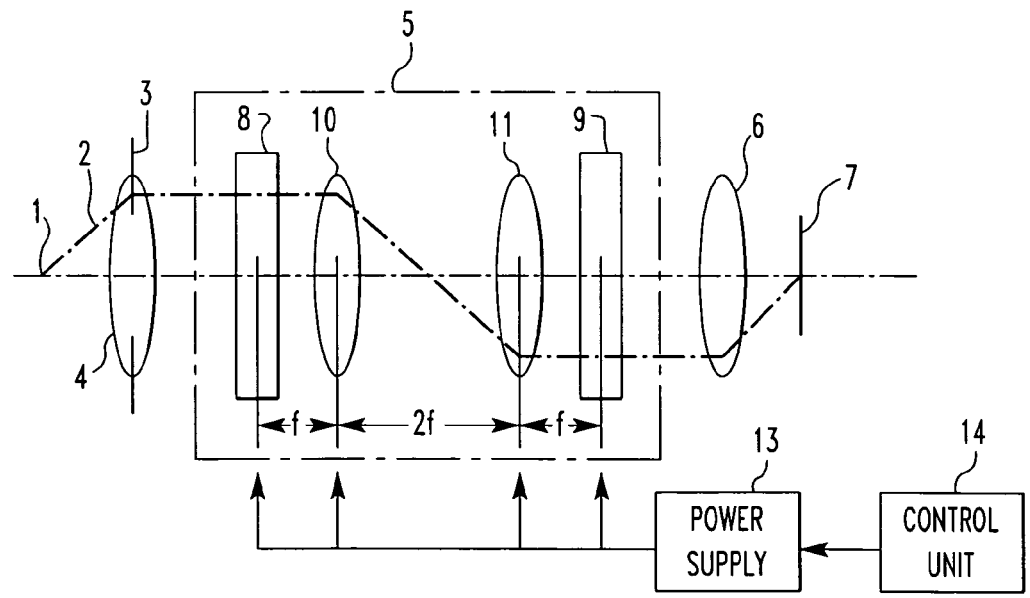
FIG. 3 is a diagram schematically showing the configuration of the illustration system of an electron microscope, illustrating the prior art method of correcting spherical aberration.

In the description provided in connection with FIG. 3, the spherical aberration corrector for use with the illumination system of an electron microscope has a light source 1, a condenser lens 4, and an objective lens 6. Indicated by numeral 7 is a specimen. The aberration corrector can be effectively used also as a spherical aberration corrector for use with the imaging system of the electron microscope. That is, in FIG. 3, if it is assumed that there exists specimen 1, objective lens 4 of the imaging system, first intermediate lens 6 of the imaging system, and image plane 7 formed by the first intermediate lens 6, then the instrument can also be operated as a spherical aberration corrector for use with the imaging system. Accordingly, this theory also applies to the instrument of FIG. 1. An example of application of the spherical aberration corrector of the present invention to an electron microscope is described below by referring to FIG. 2.

Figure 2:
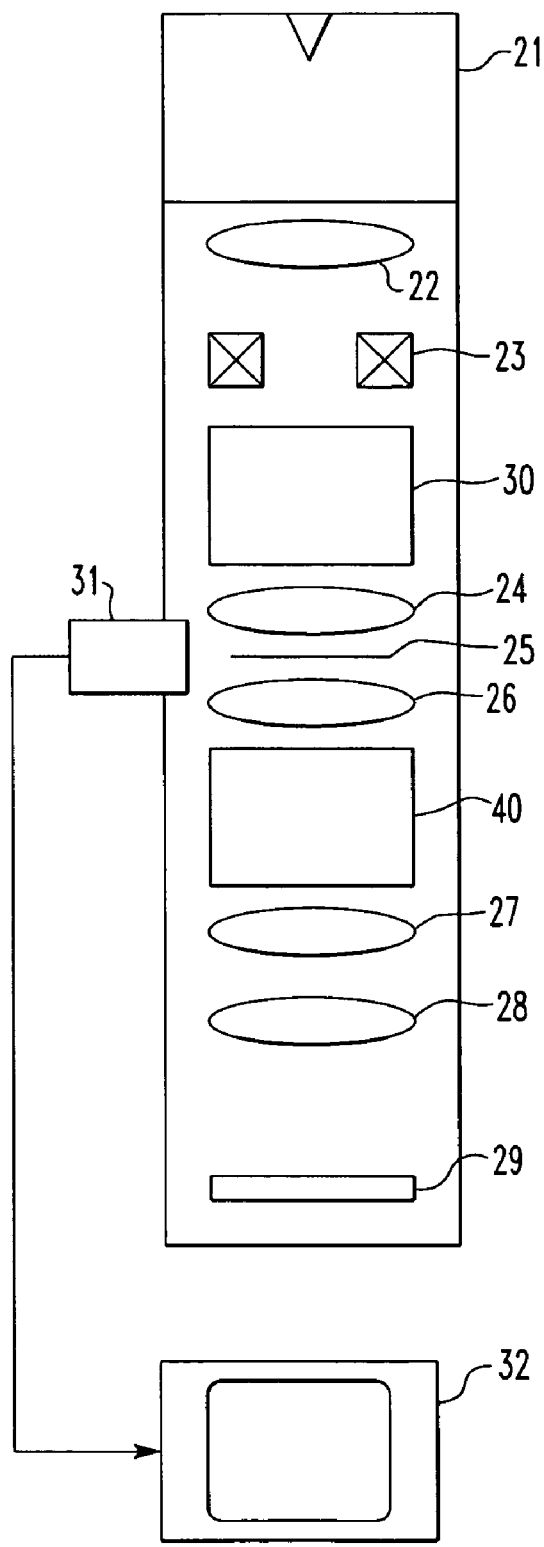
FIG. 2 is a diagram showing an example in which a spherical aberration corrector according to the present invention is applied to an electron microscope.

FIG. 2 is a diagram of the electron microscope using a spherical aberration corrector of the present invention. The instrument has an electron gun 21 for giving a desired energy for producing an electron beam, a system of condenser lenses 22 for focusing the beam, a deflector 23 for deflecting and scanning the beam in two dimensions, and an objective lens 24 for irradiating a specimen 25 with the beam. The electron optical system made up of these components 21–24 is called the illumination system.

In this illumination system, some methods are available to irradiate the specimen 25 with the electron beam. In a first method, the beam is finely focused onto a desired location on the specimen 25. In a second method, a desired region on the specimen 25 is scanned in two dimensions, using the deflector 23, with the electron beam that has been sharply focused. In a third method, a desired region on the specimen 25 is irradiated with the electron beam having a uniform diameter without sharply focusing or scanning the beam. Specifically, the diameter is set equal to the size of the desired region.

In the second method described above, as the specimen 25 is irradiated with the electron beam, secondary electrons and so on are produced from the specimen. A detector 31 detects the secondary electrons. The output signal from the detector 31 is amplified and otherwise processed and applied to a display device 32, such as a CRT, synchronized with the deflection signal used in the deflector 23. In this way, SEM imaging is enabled, i.e., SEM images can be observed.

Referring still to FIG. 2, there are shown an objective lens 26, intermediate lenses 27, and a projector lens 28. The objective lens 26 is used to direct the electron beam at the specimen 25, for example, by the above-described third method and to magnify the TEM image of the beam transmitted through the specimen 25. The intermediate lenses 27 further magnify the TEM image magnified by the objective lens 26. The projector lens 28 is used to project the magnified TEM image onto a fluorescent screen 29. The electron optical system made up of these components 26–29 is called the imaging system. The electron gun 21 and these components located under the gun are all placed in a vacuum environment. In the above description, the objective lens assembly is made up of the two lenses 24 and 26, for the sake of illustration. Usually, one lens can be operated to perform the functions of the two objective lenses 24 and 26.

The TEM image may also be observed by placing a two-dimensional image detector (not shown), such as a CCD image sensor, instead of the fluorescent screen 29 in the position of the screen 29 and supplying the output signal from the detector into the display device 32. Furthermore, a TEM detector (not shown) for detecting transmitted electrons may be positioned instead of the fluorescent screen 29 in a position close to the screen 29, and electrons transmitted through the specimen 25 may be detected using the second method when the specimen is irradiated with the electron beam. The output signal from the detector may be amplified and otherwise processed. The amplified signal may be input into the display device 32, such as a CRT, synchronized with the deflection signal used in the deflector 23. Thus, STEM imaging can be carried out.

Referring also to FIG. 2, a spherical aberration corrector used when the spherical aberration corrector 5 of the present invention is applied to the illumination system is indicated by numeral 30. A spherical aberration corrector used when the spherical aberration corrector 5 of the present invention is applied to the imaging system is indicated by numeral 40. The spherical aberration corrector 30 is used to obtain a finer electron probe by correcting aberration in the focused electron beam when the first or second illumination method is used in the illumination system. The spherical aberration corrector 40 is used to obtain a higher-resolution magnified image by correcting aberration in the objective lens 26 in the imaging system when the third illumination method is used in the illumination system.

The operating principle and operation of the spherical aberration corrector having the added period-varying circuit 15 in the electron microscope as described above are described in detail. To simplify the illustration, a case where the present invention is applied to creation of a hexapole field using magnetic hexapole elements is described now.

Electric current $I_k$ ($1 < k \leq 6$) supplied to each pole of each magnetic hexapole element can be given by $$I_k = A(\cos(k\pi) + C_1 \cos(\theta_1 + k\pi/3) + C_2 \cos 2(\theta_2 + k\pi/3)) \qquad (3)$$

In this case, the strength of the field can be controlled because the hexapole field is created using the hexapole elements. In the case of the above formula, the phase angle of the field is constant. In the formula, A is the strength of the hexapole field created by the spherical aberration corrector to correct spherical aberration. $C_1$, $\theta_1$, $C_2$, and $\theta_2$ are coefficients used to cancel deflecting and quadrupole fields concomitantly produced due to mechanical inaccuracy of the hexapole elements. The coefficients $C_1$ and $C_2$ have values large enough to cancel deflecting and quadrupole fields in the instrument, and each can be varied from positive to negative value. Each of the coefficients $\theta_1$ and $\theta_2$ can be varied with a range of 360 degrees. A reference angle for display and the reference angle of each coefficient are previously set to be equal to each other such that the direction of the displayed image on the viewing screen corresponds to the directions of the coefficients $\theta_1$ and $\theta_2$.

In the period-varying circuit 15, the coefficient A is varied periodically as given by $$A = B \cos(2\pi t f) \qquad (4)$$

where t (sec) is time and f is the number of variations per second, or frequency. For example, f=5 Hz.

With the electron microscope having the built-in spherical aberration corrector as described above, the operator of the instrument observes a SEM or STEM image by the second method or observes a TEM image by the third method while varying the coefficient A periodically based on Eq. (4) above.

At this time, if the image being observed varies while maintaining a threefold symmetry, it follows that only a hexapole field is created in the optical system including the corrector. Furthermore, it can be seen that if the image being observed shows translational motion in addition to a threefold symmetry, there is a deflecting field. If the image shows twofold symmetric variations in addition to a threefold symmetry, there is a quadrupole field. Such dynamic variations in the image can be easily discerned by the human observer, although not quantitatively.

Accordingly, the operator of the instrument who observes the image appropriately adjusts the coefficients $C_1$, $\theta_1$, $C_2$, and $\theta_2$ via the control unit 14 while observing the image that varies according to Eq. (4) above such that the image varies while maintaining a threefold symmetry without causing translational motion or twofold symmetric variations.

Specifically, the coefficients $C_1$ and $C_2$ are set to zero during operation of the period-varying circuit 15. The image is observed. A direction in which the image translates is found. The coefficient $\theta_1$ is aligned to this direction. Under this condition, the coefficient $\theta_1$ is adjusted to prevent translational motion. Consequently, it follows that the deflecting field has been canceled. Then, a direction in which the image shows twofold symmetric variations is found similarly. The coefficient $\theta_2$ is aligned to this direction. Under this condition, the coefficient $C_2$ is adjusted to prevent twofold symmetric variations. In consequence, the twofold symmetric field has been canceled. In actual operations, the above-described sequence of operations is repeated plural times to cancel the deflecting and quadrupole fields sufficiently. Furthermore, during these operations, the coefficient B may be adjusted to facilitate observing translational motion and twofold symmetric variations. Also, easier observation may be achieved by adjusting the number of variations f.

After canceling the deflecting and quadrupole fields sufficiently in this way, adjustment of the coefficient A, which is proper operation of the spherical aberration corrector, is performed. In the above embodiment, hexapole elements producing a field with a constant phase angle are described, for convenience of illustration. The same concept can be used also in a case where a dodecapole (12-pole) element, for example, is used.

In the above description, deflecting field (dipole field) and quadrupole field of orders lower than the hexapole field of interest are canceled. It would be easily understood that, generally, this method can be applied to cancellation of arbitrary multipole fields concomitantly produced other than the 2m-pole field of interest during creation of the 2m-pole magnetic field ($m \leq n$) using 2n-pole elements. For instance, deflecting (dipole) and hexapole fields are canceled during creation of a quadrupole field using a dodecapole element.

Accordingly, Eq. (3) is generalized. During creation of a 2m-pole magnetic field ($m \leq n$) using 2n-pole elements ($n=1, 2, 3, \ldots$), the strength of the kth pole is given by $$I_k = A(\cos m(k\pi/n) + C_1\cos(\theta_1 + k\pi/n) + C_2\cos2(\theta_2 + k\pi/n) + \quad (5)$$
$$C_3\cos3(\theta_3 + k\pi/n)C_n\cos n(\theta_n + k\pi/n) -$$
$$C_m\cos m(\theta_m + k\pi/n))$$

In the above equation, the final negative term is used to cancel the value of the mth term to zero. This has the same meaning as $C_m = 0$.

In the embodiment described thus far, an electron microscope having a built-in aberration corrector relying on magnetic hexapole elements is taken as an example. The present invention can be applied to various kinds of instruments utilizing a charged-particle beam, including an ion beam, and incorporating a built-in aberration corrector to focus the beam as sharply as possible or to permit ultrahigh-resolution imaging. One example is a scanning electron microscope having a built-in aberration corrector using a combination of four stages of quadrupole elements and four stages of octopole elements as shown in Japanese Patent Laid-Open No. 2003-157785 identified above.

Having thus described our invention with the detail and particularity required by the Patent Laws, what is desired protected by Letters Patent is set forth in the following claims.

The invention claimed is:

1. An apparatus for producing a 2n-pole field ($n=1, 2, 3, \ldots$) using at least one magnetic or electrostatic 2n-pole element, wherein strength $I_k$ ($1 \leq k \leq 2n$) of the kth pole in the 2n-pole element is controlled with control parameters A, $C_j$, and $\theta_j$ ($1 \leq j \leq n-1$), based on a control formula given by $$I_k = A(\cos(k\pi) + C_1\cos(\theta_1 + k\pi/n) + C_2\cos2(\theta_2 + k\pi/n) +$$
$$C_3\cos3(\theta_3 + k\pi/n) + \cdots + C_{n-1}\cos(n-1)(\theta_{n-1} + k\pi/n))$$

and wherein the parameter A is varied continuously at frequency f with respect to real time t given by $$A = B\cos(2\pi tf).$$

2. An apparatus for producing a 2m-pole magnetic field using at least one magnetic or electrostatic 2n-pole element ($n=1, 2, 3, \ldots, m \leq n$), wherein strength $I_k$ ($1 \leq k \leq 2n$) of the kth pole of the 2n-pole element is controlled with control parameters A, $C_j$, and $\theta_j$ ($1 \leq j \leq n$, $C_m = 0$) based on a control formula given by $$I_k = A(\cos(mk\pi/n) + C_1\cos(\theta_1 + k\pi/n) + C_2\cos2(\theta_2 + k\pi/n) +$$
$$C_3\cos3(\theta_3 + k\pi/n) + \cdots + C_n\cos n(\theta_n + k\pi/n))$$

and wherein the parameter A is varied continuously at frequency f with respect to real time t given by $$A = B\cos(2\pi tf).$$

3. A spherical aberration corrector for use in an electron microscope having two axisymmetric lenses disposed between two multipole elements, wherein each of the multipole elements is a magnetic or electrostatic hexapole element, wherein where a hexapole field is created, strength $I_k$ ($1 \leq k \leq 6$) of each pole is controlled with control parameters A, $C_1$, $\theta_1$, $C_2$, and $\theta_2$ based on a control formula given by $$I_k = A(\cos(k\pi) + C_1\cos(\theta_1 + k\pi/n) + C_2\cos2(\theta_2 + k\pi/n)$$

and wherein during this control, the parameter A is varied continuously at frequency f with respect to real time t given by $$A = B\cos(2\pi tf).$$

4. A spherical aberration corrector for use in an electron microscope having two axisymmetric lenses disposed between two multipole elements, wherein each of the multipole elements is a magnetic or electrostatic 2n-pole element ($n=1, 2, 3, \ldots$), wherein where a hexapole field is created, strength $I_k$ ($1 \leq k \leq 2n$) of each pole is controlled with control parameters A, $C_j$, and $\theta_j$ ($1 \leq j \leq n$), based on a control formula given by $$I_k = A(\cos(3k\pi/n) + C_1\cos(\theta_1 + k\pi/n) + C_2\cos2(\theta_2 + k\pi/n) + C_4\cos4(\theta_4 + k\pi/n)C_5\cos5(\theta_5 + k\pi/n) + \cdots + C_n\cos n(\theta_n + k\pi/n))$$

and wherein during this control, the control parameter A is varied continuously at frequency f with respect to real time t given by $$A = B\cos(2\pi tf).$$

* * * * *